(12) United States Patent
Nishiura

(10) Patent No.: US 7,863,916 B2
(45) Date of Patent: Jan. 4, 2011

(54) DEVICE MOUNTED APPARATUS, TEST HEAD, AND ELECTRONIC DEVICE TEST SYSTEM

(75) Inventor: Koei Nishiura, Tokyo (JP)

(73) Assignee: Advantest Corporation, Tokyo (JP)

( * ) Notice: Subject to any disclaimer, the term of this patent is extended or adjusted under 35 U.S.C. 154(b) by 4 days.

(21) Appl. No.: 12/093,976

(22) PCT Filed: Nov. 17, 2005

(86) PCT No.: PCT/JP2005/021137

§ 371 (c)(1),
(2), (4) Date: Jul. 21, 2008

(87) PCT Pub. No.: WO2007/057959

PCT Pub. Date: May 24, 2007

(65) Prior Publication Data

US 2009/0027073 A1    Jan. 29, 2009

(51) Int. Cl.
*G01R 31/00* (2006.01)
(52) U.S. Cl. ..................................... 324/760
(58) Field of Classification Search .................. None
See application file for complete search history.

(56) References Cited

U.S. PATENT DOCUMENTS

| 6,052,284 A * | 4/2000 | Suga et al. ................ 361/699 |
| 6,243,268 B1 * | 6/2001 | Kang et al. ................ 361/715 |
| 6,625,557 B1 * | 9/2003 | Perkins et al. ............. 702/117 |
| 7,072,180 B2 | 7/2006 | Nishiura |
| 7,183,785 B2 * | 2/2007 | Roberts et al. ............. 324/763 |
| 2007/0200555 A1 | 8/2007 | Mizushima et al. |
| 2007/0222455 A1 | 9/2007 | Haruta et al. |
| 2007/0296432 A1 | 12/2007 | Mineo et al. |

FOREIGN PATENT DOCUMENTS

| JP | 3-196656 | 8/1991 |
| JP | 8-54441 | 2/1996 |
| JP | 2003-28920 | 1/2003 |
| WO | 2005/004571 | 1/2005 |

OTHER PUBLICATIONS

English language Abstract of JP 2003-28920, Jan. 29, 2003.
English language Abstract of JP 8-54441, Feb. 27, 1996.
English language Abstract of JP 3-196656, Aug. 28, 1991.
English language Abstract of WO 2005/004571, Jan. 13, 2005.

* cited by examiner

*Primary Examiner*—Roberto Velez
(74) *Attorney, Agent, or Firm*—Greenblum & Bernstein P.L.C.

(57) ABSTRACT

A device mounted apparatus includes a board on which a plurality of devices are mounted and a device cooling cover covering the plurality of devices, and formed inside it with a channel through which a refrigerant can flow. The device cooling cover includes a first cover covering only the measurement device among the plurality of devices, and a second cover covering only the power device among the plurality of devices. The first cover and the second cover are electrically insulated from each other.

20 Claims, 13 Drawing Sheets

DEVICE MOUNTED APPARATUS, TEST HEAD, AND ELECTRONIC DEVICE TEST SYSTEM

TECHNICAL FIELD

The present invention relates to a device mounted apparatus comprising: a board on which a device is mounted; and a device cooling cover for cooling the device mounted on the board, and a test head and electronic device test system comprising that device mounted apparatus.

BACKGROUND ART

In the process of production of semiconductor devices, an electronic device test system is necessary for testing the finally produced IC chips or other electronic devices. This type test of electronic device is executed by inputting a test pattern to the IC chip under test, operating it and inspecting the response pattern in the state with the test environment set a temperature environment of an ordinary temperature, high temperature, or low temperature.

A general electronic device test system comprises: a tester storing a program for sending out a test pattern and inspecting a response pattern; a test head having contact terminals for electrically connecting this tester and an IC chip under test; and a handler successively conveying IC chips under test to the contact terminals and physically classifying the finished tested IC chips under test in accordance with the test results. Further, IC chips under test are set in the handler, are conveyed to the test head, and are pushed against the contact terminals to electrically connect them so as to execute the desired operational test.

The test head of such an electronic device test system comprises a large number of pin electronics cards (device mounted apparatus) used as interfaces for the input/output terminals of the IC chips under test. Each pin electronics card is formed by mounting a mensurative high frequency circuit, power circuit, or other various devices on a board. As the high frequency circuit mounted on a pin electronics card, an analog comparator circuit receiving an analog response signal output from an IC chip under test and converting it to a logic signal by the desired threshold voltage, a high precision timing judgment circuit, etc. may be mentioned. These circuits correspond to the IC chip under test.

The various devices of a pin electronics card become high in temperature due to the heat they generate at the time of testing IC chips under test. Therefore, as a pin electronics card able to cool devices generating heat on their own, one covering the front and back surfaces of the board by a cover and making a refrigerant flow inside the cover to bring the refrigerant into direct contact with the heat generating devices has been known in the past (for example, see Patent Document 1).

However, in this pin electronics card, a single board is provided with a cover at the front and back. All of the devices mounted on the same board are covered by the same cover. Therefore, the current generated in the cover due to the electromagnetic waves etc. radiated from the power circuits is propagated as noise to the high frequency circuits, a drop in the S/N ratios of the high frequency circuits etc. is caused and a securing of high precision tests of IC chips under test becomes difficult in some cases. Further, depending on the timing of generation of the noise source or frequency component, sometimes the test quality will fluctuate for the IC chips under test.

Further when conducting a test by a desired high precision while a high frequency circuit applies and receives an analog signal or high frequency signal to and from an IC chip under test, sometimes interference noise is caused along with the high frequency circuit applying and receiving a strong level or very weak level signal and other circuits are covered by the same cover. As a result, it sometimes becomes difficult to secure high precision tests.

[Patent Document 1] WO2005/004571

DISCLOSURE OF THE INVENTION

The present invention has as its object the provision of a device mounted apparatus able to suppress propagation of noise between devices mounted on a board and secure a high precision test of the device under test and a test head and electronic device test system.

To achieve the above object, according to the present invention, there is provided a device mounted apparatus comprising: a board on which a plurality of devices are mounted; and a device cooling cover covering the plurality of devices and formed inside it with a channel through which a refrigerant can flow, wherein the device cooling cover includes: a first cover covering part of the devices among the plurality of devices; and a second cover covering at least other part of the devices among the plurality of devices, and the first cover and the second cover are electrically insulated from each other (see claim 1).

In the present invention, the device cooling cover is divided into a first cover and a second cover. These are electrically insulated from each other. Part of the devices among the plurality of devices mounted on the board are covered by the first cover, while at least other part of the devices are covered by the second cover. Due to this, for example, by covering devices easily generating electromagnetic waves etc. by the first cover and covering devices susceptible to noise by the second cover, it is possible to prevent the propagation of noise from one device to another device and possible to secure high precision testing.

While not particularly limited in the above invention, preferably a part of a peripheral edge of the first cover and a part of a peripheral edge of the second cover overlap to form an overlapping part, and an insulator is interposed between the first cover and the second cover at the overlapping part (see claim 2).

While not particularly limited in the above invention, preferably a fastening means for fastening the first cover and the second cover to the board, wherein at the overlapping part, only the first cover overlapping the second cover is directly fastened by the fastening means to the board and the second cover is fastened through the first cover to the board (see claim 3).

Due to this, for example it is possible to reduce the number of bolts or other fastening means and make efficient use of the space on the board.

While not particularly limited in the above invention, preferably the device cooling cover is provided at both main surfaces of the board, and the device mounted apparatus further comprises a communicating means for making a refrigerant flow between the first cover and the second cover and for making a refrigerant flow between the device cooling covers provided at both main surfaces of the board (see claim 4).

While not particularly limited in the above invention, the first cover has: a first front surface cover provided at a front surface side of the board; and a first back surface cover provided at a back surface side of the board, the second cover has: a second front surface cover provided at a front surface side of the board; and a second back surface cover provided at a back surface side of the board, the second back surface cover partially faces the first front surface cover and/or the first back surface cover partially faces the second front surface cover; and the communicating means includes: through holes formed in the board at the part where the second back surface cover faces the first front surface cover; and/or, through holes formed in the board at the part where the first back surface cover faces the second front surface cover (see claim 5).

The first cover and the second cover are communicated through holes formed in the part where the first cover and the second cover face each other across the board. Due to this, it is possible to simplify the connection structure of the channel between the first cover and the second cover.

While not particularly limited in the above invention, preferably the communicating means includes: through holes formed in the board at the part where the first back surface cover faces the first front surface cover; and/or through holes formed in the board at the part where the second back surface cover faces the second front surface cover (see claim 6).

To achieve the above object, according to the present invention, there is provided a device mounted apparatus comprising: a board on which a plurality of devices are mounted; and a device cooling cover covering the plurality of devices and formed inside it with a channel through which a refrigerant can flow, wherein the device cooling cover are divided into at least two and has a first cover and a second cover, and the device cooling cover is attached to the board in the state where the first cover and the second cover are electrically insulated (see claim 7).

While not particularly limited in the above invention, preferably the device cooling cover is provided at both main surfaces of the board, the board is formed at its front and back with through holes for making a refrigerant flow, and the first cover and the second cover face each other through the through holes at the front and back of the board (see claim 8).

To achieve the above object, according to the present invention, there is provided a test head comprising: a contact part which is brought into electrically contact with a device under test and any one of the above device mounted apparatus electrically connected to the contact part (see claim 9).

To achieve the above object, according to the present invention, there is provided an electronic device test system comprising: the above test head, a handler for bringing a device under test into electrically contact with a contact part of the test head, and a tester inputting a test signal to the device under test for operation and inspecting a response signal (see claim 10).

DESCRIPTION OF NOTATIONS

Figure 1:
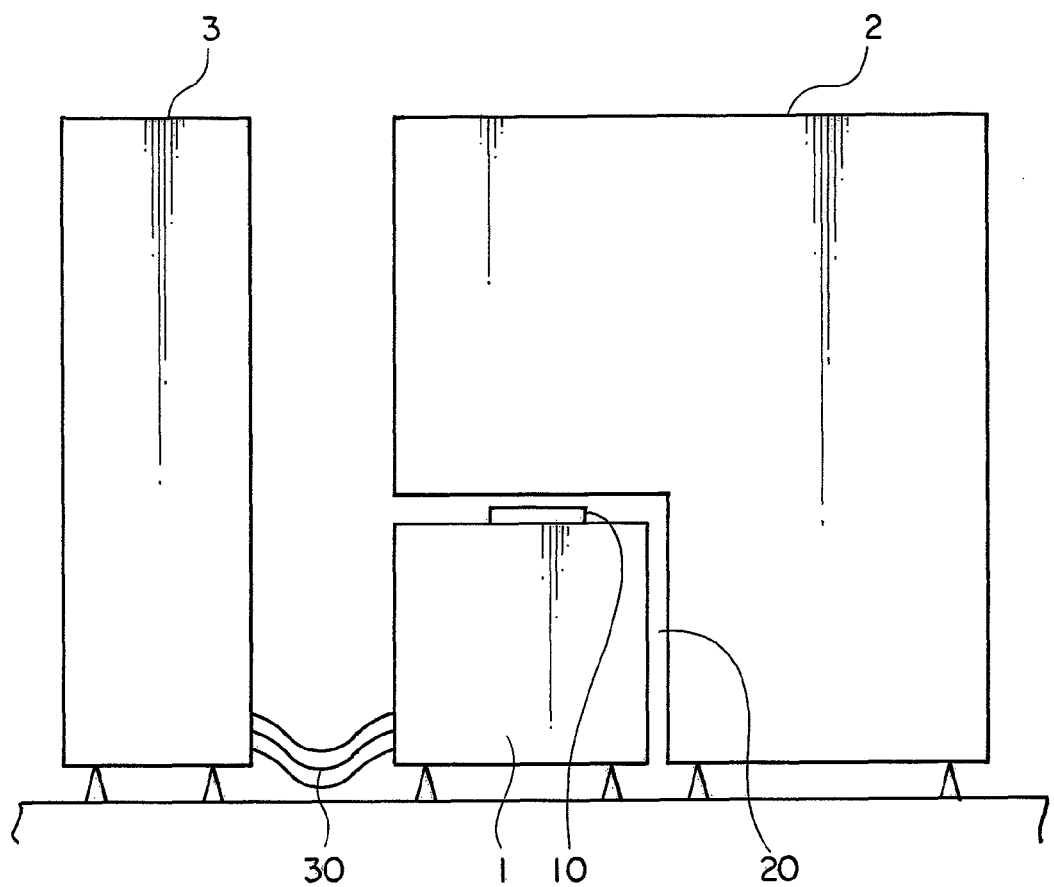
FIG. 1 is a side view showing an overall electronic device test system according to an embodiment of the present invention.

1 . . . test head
2 . . . handler
3 . . . tester
4 . . . pin electronics card
5 . . . board
5a to 5j . . . through holes
6 . . . device cooling cover
61 . . . first cover
62 . . . first front surface cover
62a . . . projecting part
63 . . . first back surface cover
63a . . . projecting part
65 . . . second cover
66 . . . second front surface cover
66a . . . step part
66c to 66f . . . first to fourth partition walls
66g . . . inlet
67 . . . second back surface cover
67a . . . step part
67c to 67f . . . first to fourth partition walls
67g . . . outlet
7 . . . insulator
8 . . . bolt
TD . . . measurement device
PD . . . power device

BEST MODE FOR CARRYING OUT THE INVENTION

Below, embodiments of the present invention will be explained based on the drawings.

Figure 2:
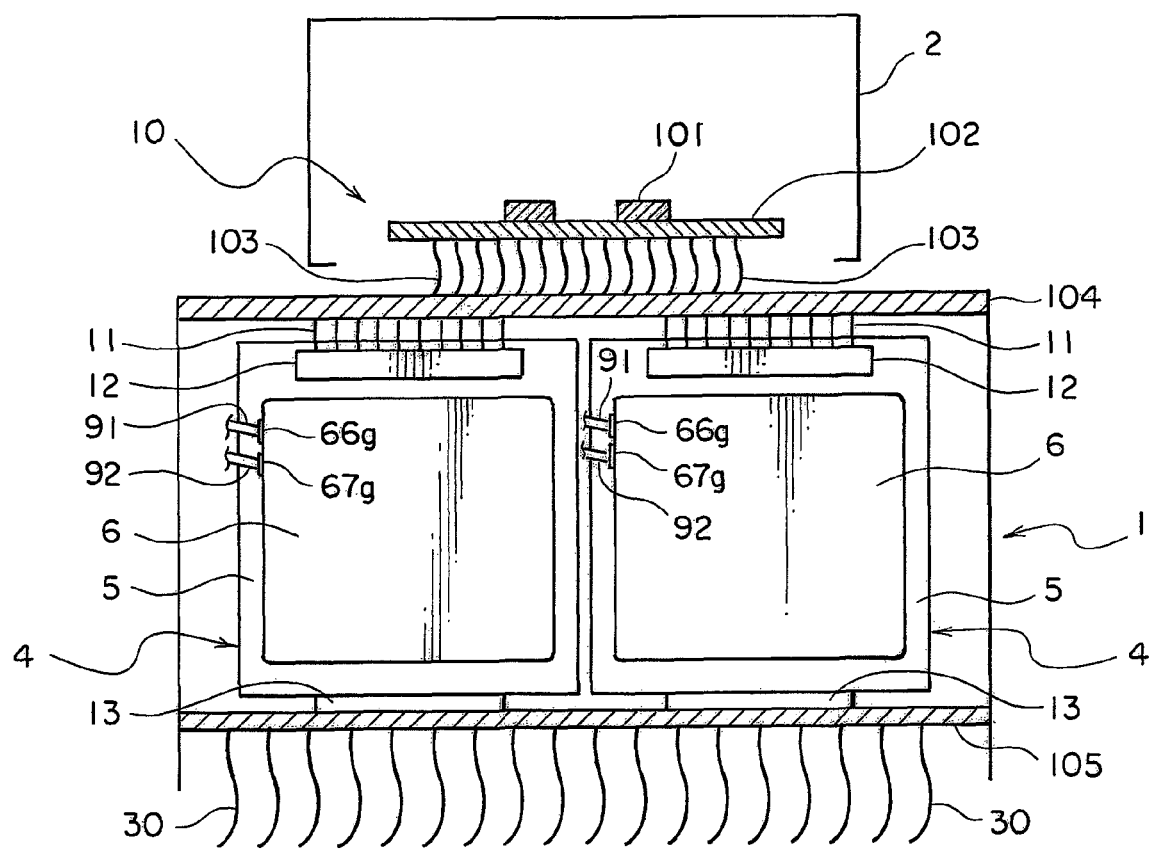
FIG. 2 is a schematic front cross-sectional view showing a test head according to an embodiment of the present invention.
Figure 3:
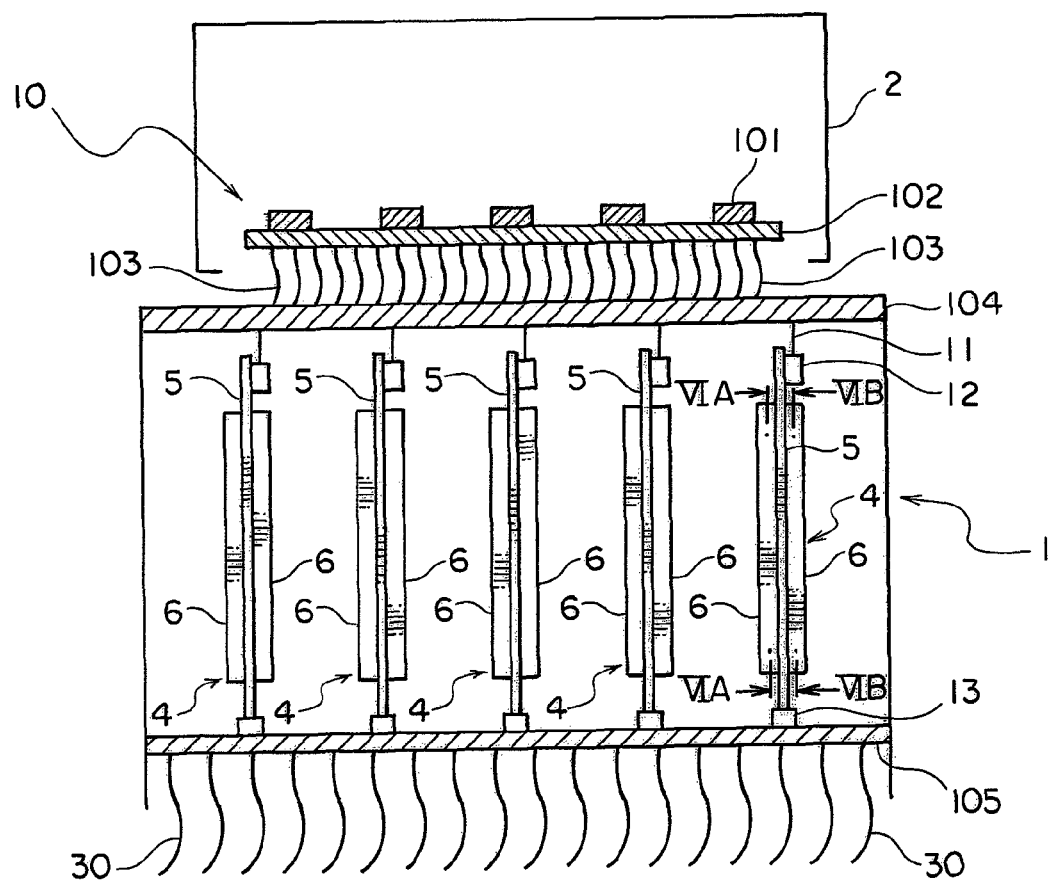
FIG. 3 is a schematic side cross-sectional view showing a test head according to an embodiment of the present invention.

FIG. 1 is a side view showing an overall electronic device test system according to an embodiment of the present invention, FIG. 2 is a schematic front cross-sectional view showing a test head according to an embodiment of the present invention, and FIG. 3 is a schematic side cross-sectional view showing a test head according to an embodiment of the present invention.

As shown in FIG. 1, the test head 1 according to the embodiment of the present invention is arranged exchangeably in a space part 20 provided at the bottom part of the handler 2 and is electrically connected through a cable 30 to the tester 3.

As shown in FIG. 2 and FIG. 3, a contact part 10 is provided at the top part of the test head 1. An IC chip under test is tested by being brought into electrical contact with a socket 101 of the contact part 10 through holes formed in the handler 2.

The handler 2 successively conveys pre-test IC chips to the contact part 10 of the test head 1, pushes each conveyed IC chip under test against a socket 101 of the contact part 10, then classifies and stores the tested IC chip in accordance with the test result after testing the IC chip under test by a signal from the tester body 3 through the test head 1 and cable 30. The configuration is not particularly limited.

As the handler 2, for example, a known handler of a heat plate type or chamber type may be used.

Here, a "heat plate type handler" is a handler of a type comprising: a conveyor system for conveying an IC chip under test; a heat plate applying high temperature thermal stress to the IC chip under test; and predetermined trays such as feed trays or classification trays etc.

Further, a "chamber type handler" is a handler of a type comprising: a storage unit storing customer trays on which pre-test and post-test IC chips are carried; a loader unit transferring IC chips under test from a customer tray to a test tray and supplying IC chips under test carried on the test tray to a chamber unit; a chamber unit applying a predetermined thermal stress to the IC chips under test to test them; and an unloader unit taking out tested IC chips from the chamber unit and classifying and storing them on customer trays.

The contact part 10 of the test head 1, as shown in FIG. 2 and FIG. 3, comprises sockets 101, a socket board 102 on which the sockets 101 are mounted at the top surface, and a performance board 104 electrically connected with the socket board 102 at the bottom side of the socket board 102 through the cable 103.

The sockets 101 are designed to enable IC chips under test to be electrically connected. Further, by sending an IC chip under test a testing electrical signal through a socket 101 from the tester body 3 and accordingly sending the response signal read from the IC chip under test to the tester body 3, the IC chip under test is tested for performance, functions, etc.

Inside the test head 1, a plurality of pin electronics cards 4 (device mounted apparatus) are provided. The performance board 104 is electrically connected to the pin electronics cards 4.

In the present embodiment, as shown in FIG. 2 and FIG. 3, a pin holding part 12 which holds a plurality of spring probe pins 11 is provide at the top end of each pin electronics card 4. By contact of the spring probe pins 11 with the pads provided at the bottom surface of the performance board 104, the pin electronics card 4 and performance board 104 are electrically connected. Note that in the present invention, the method of connection of the pin electronics card 4 and the performance board 104 is not particularly limited, but for example any connection method through a cable or a connector etc. may be adopted.

On the other hand, a connector 13 is provided at the bottom end of the pin electronics card 4. This connector 13 is attached to a back board 105 positioned at the floor part of the test head 1. The pin electronics card 4 is electrically connected through the connector 13, the back board 105, and the cable 30 to the tester 3. In this way, the contact part 10 of the test head 1 is electrically connected to the tester 3 with the interposition of the pin electronics card 4.

Note that in the present invention, the structure of the test head 1 is not limited to the example shown in FIG. 2 and FIG. 3. It may be suitably changed in a range enabling input of a test signal to an IC chip under test in electrical contact with the socket 101. For example, in the present embodiment, the pin electronics card 4 is provided vertically with respect to the back board 105, but it may also be provided horizontally with respect to the back board 105. Further, in the present embodiment, 2×5 pin electronics cards 4 are housed in the test head 1 for 2×5 sockets. The number of the pin electronics cards 4 is not particularly limited, but may be suitably determined in accordance with the number of sockets 101 etc.

Figure 4A:
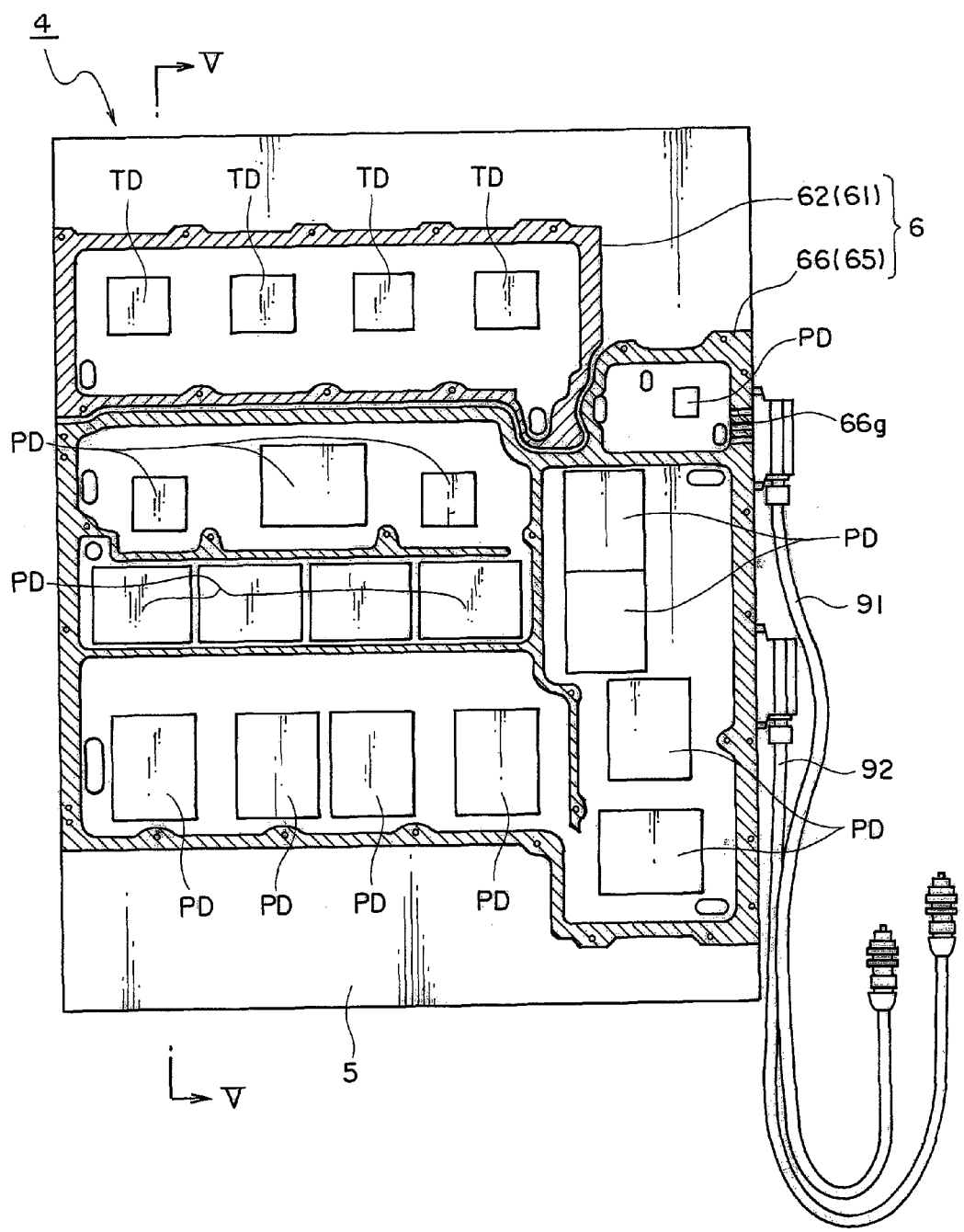
FIG. 4A is a front side cross-sectional view showing a pin electronics card according to an embodiment of the present invention and is a cross-sectional view along the line IVA-IVA of FIG. 3.
Figure 4B:
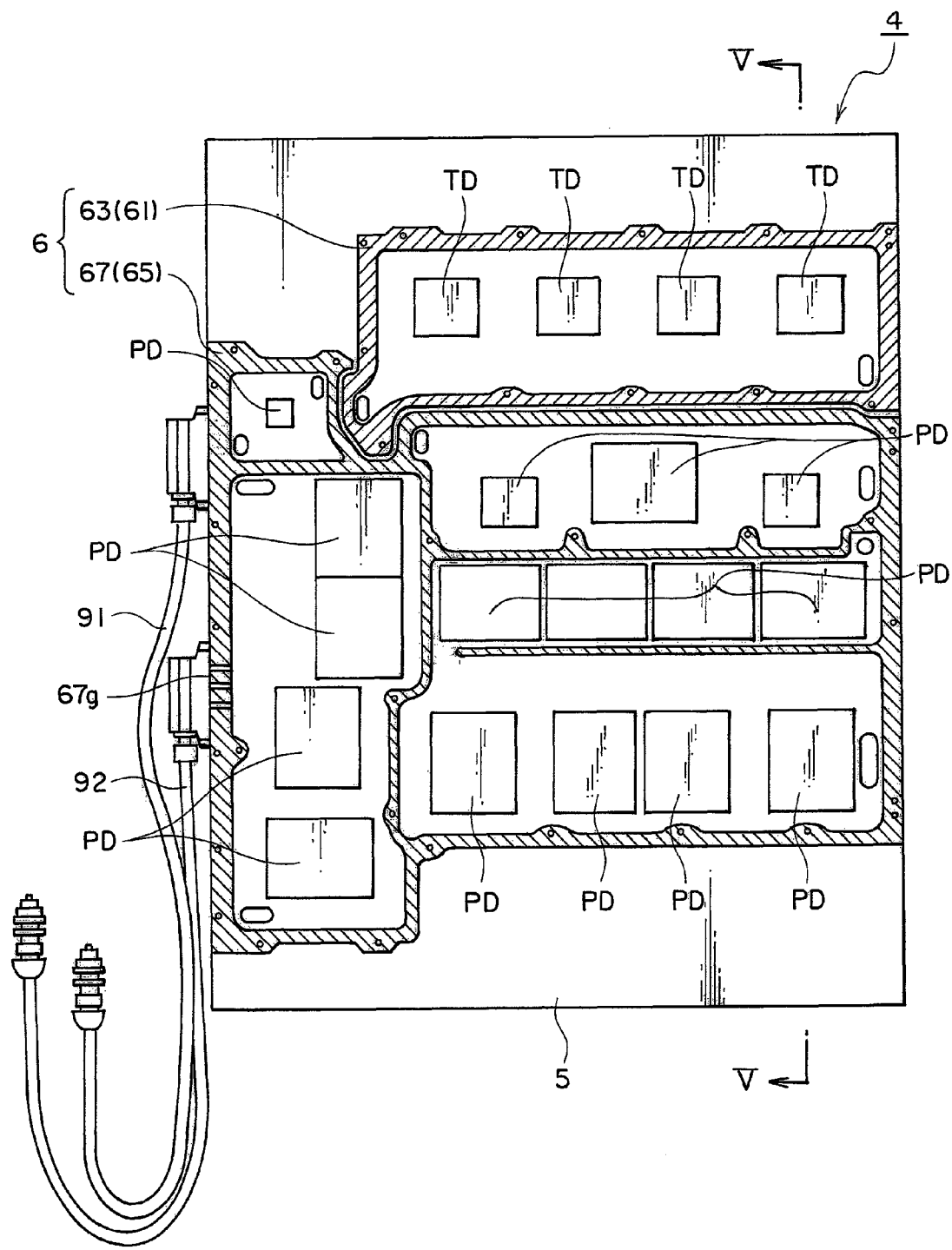
FIG. 4B is a back side cross-sectional view showing a pin electronics card according to an embodiment of the present invention and is a cross-sectional view along the line IVB-IVB of FIG. 3.
Figure 5:
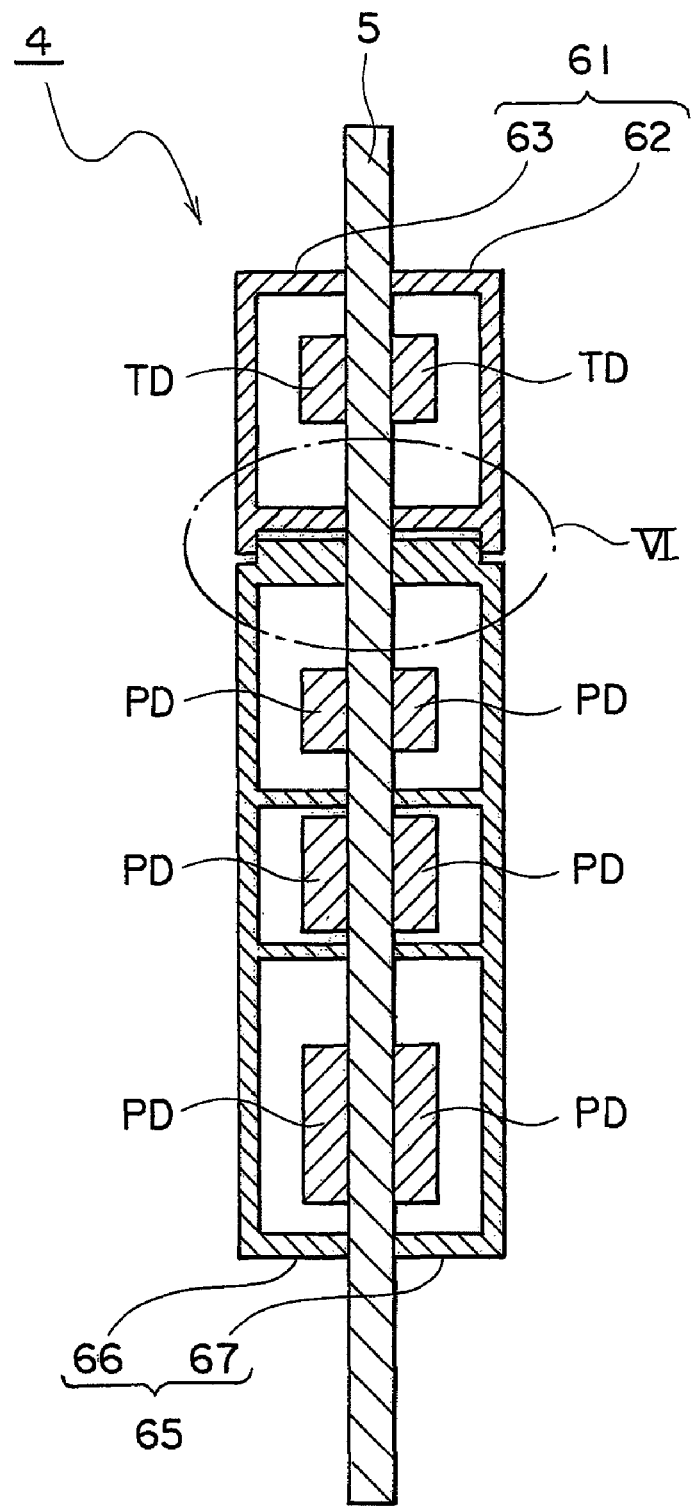
FIG. 5 is a cross-sectional view showing the configuration of a pin electronics card according to an embodiment of the present invention and is a cross-sectional view along the line V-V of FIG. 4A and FIG. 4B.
Figure 6:
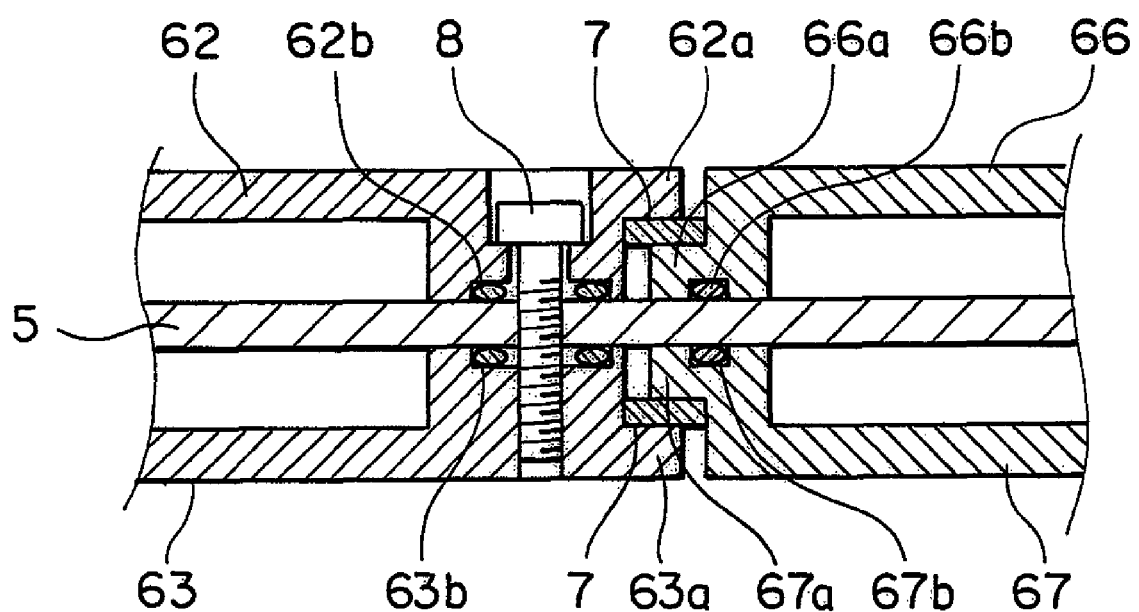
FIG. 6 is an enlarged view of a part VI of FIG. 5.
Figure 7:
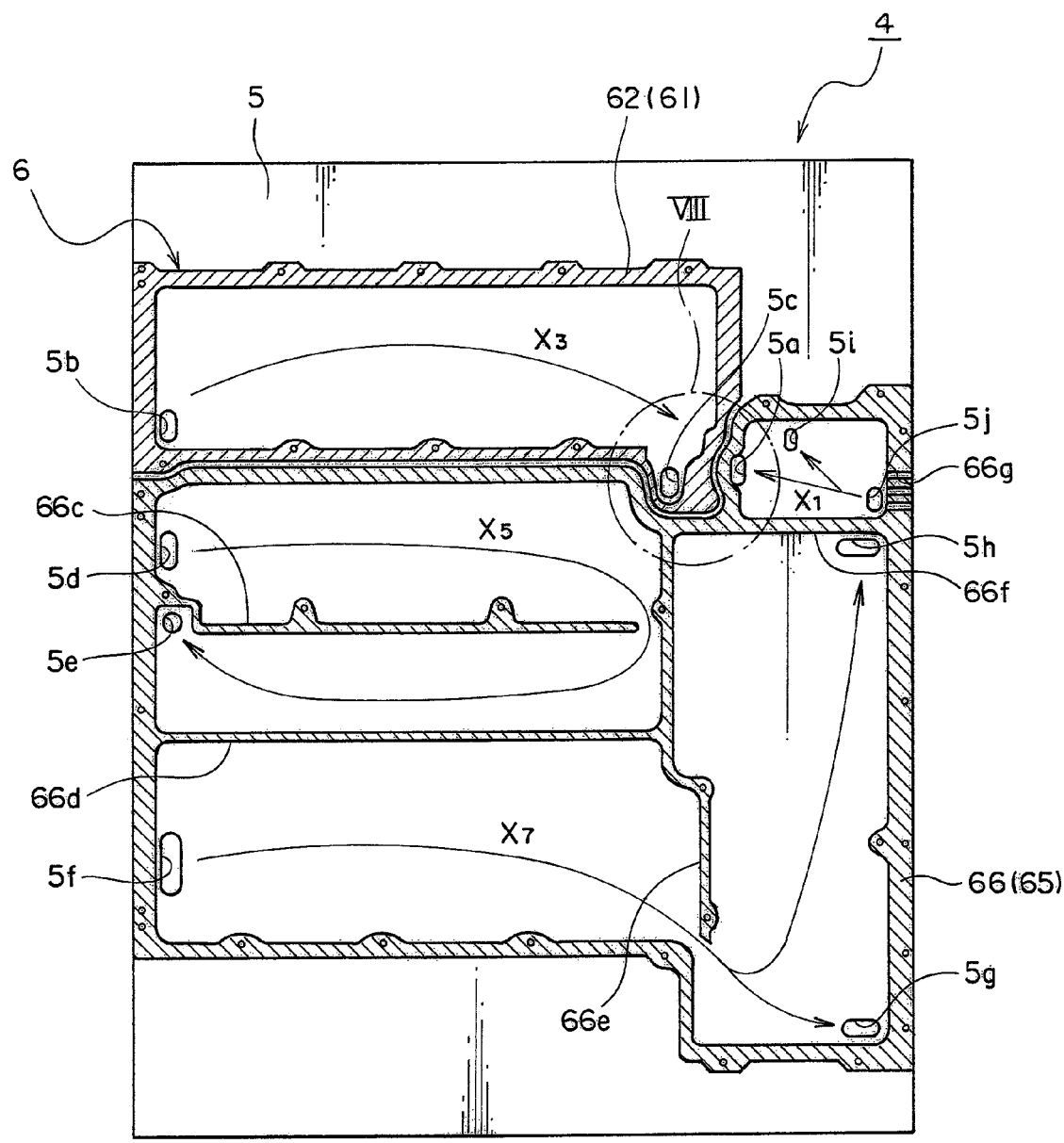
FIG. 7 is a cross-sectional view showing the flow of a refrigerant in the front surface side of a pin electronics card according to an embodiment of the present invention.
Figure 8:
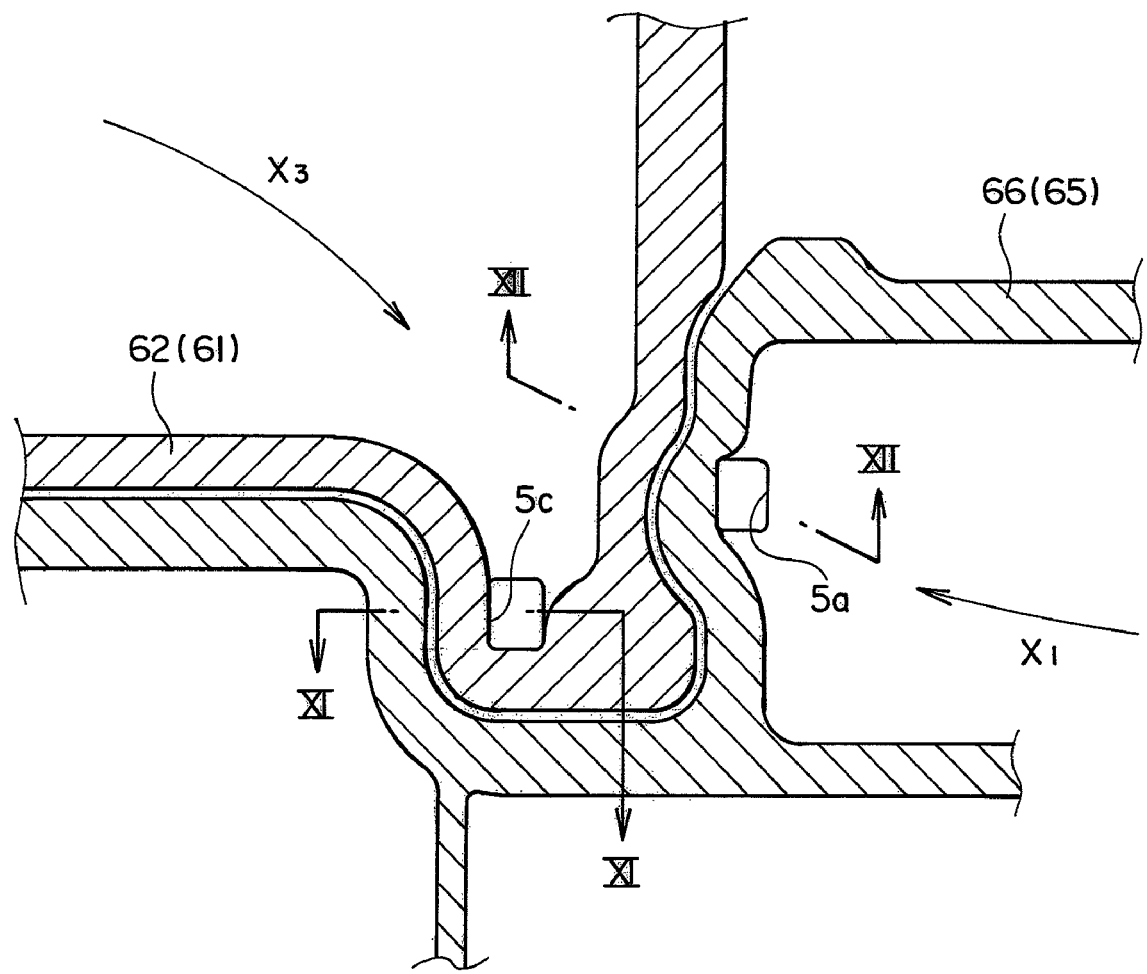
FIG. 8 is an enlarged view of a part VIII of FIG. 7.
Figure 9:
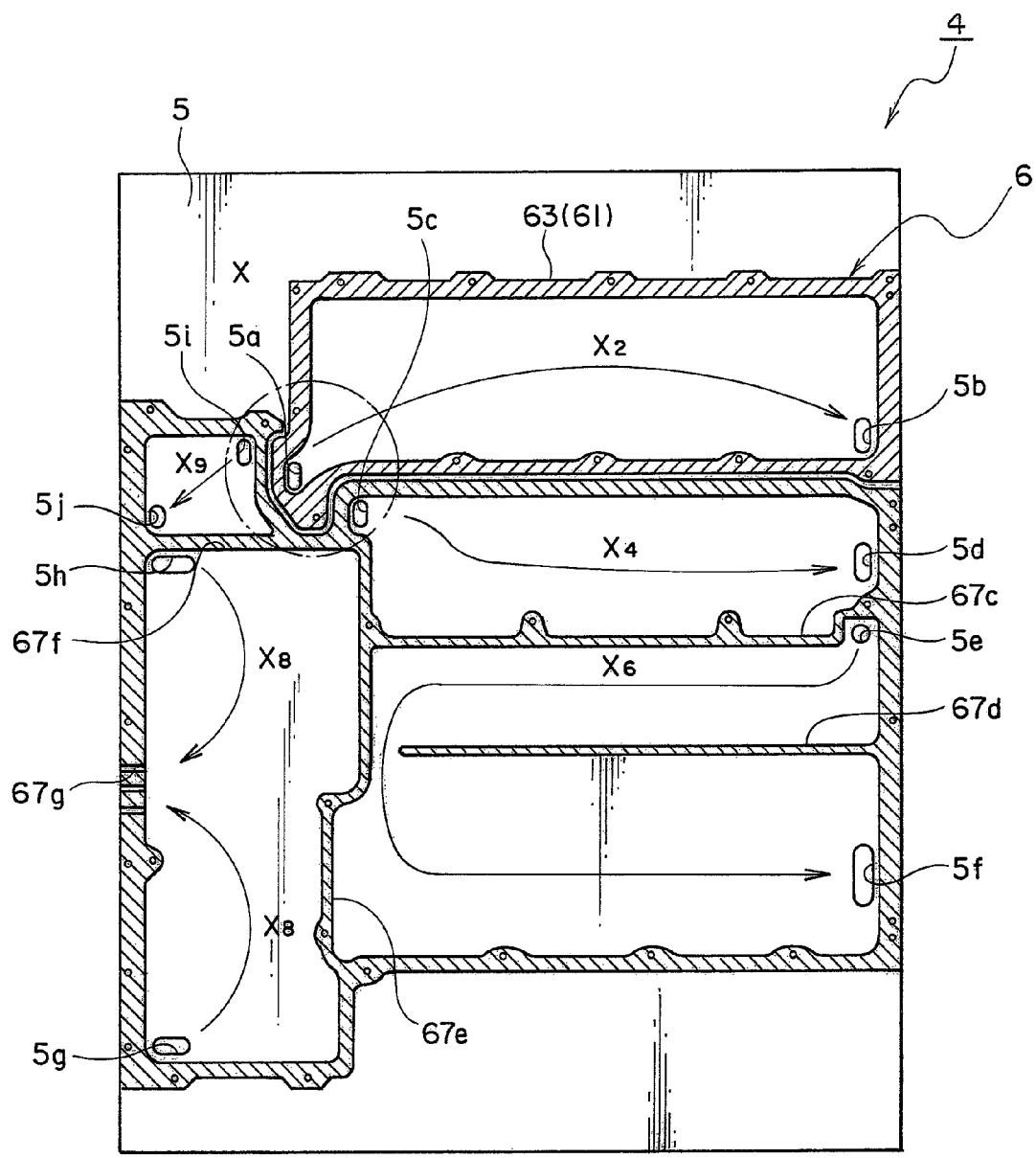
FIG. 9 is a cross-sectional view showing the flow of a refrigerant in the back surface side of a pin electronics card according to an embodiment of the present invention.
Figure 10:
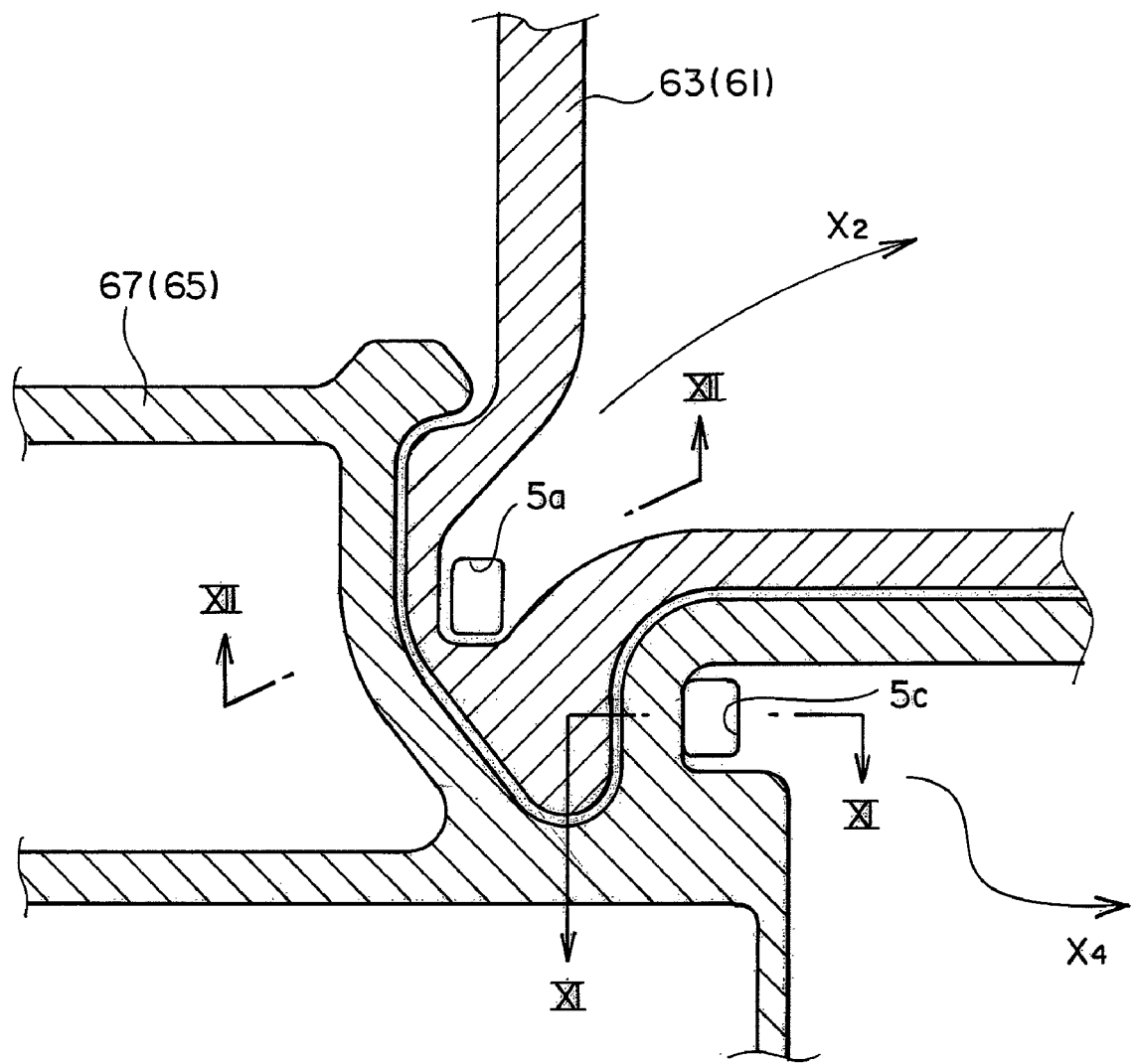
FIG. 10 is an enlarged view of a part X of FIG. 9.
Figure 11:
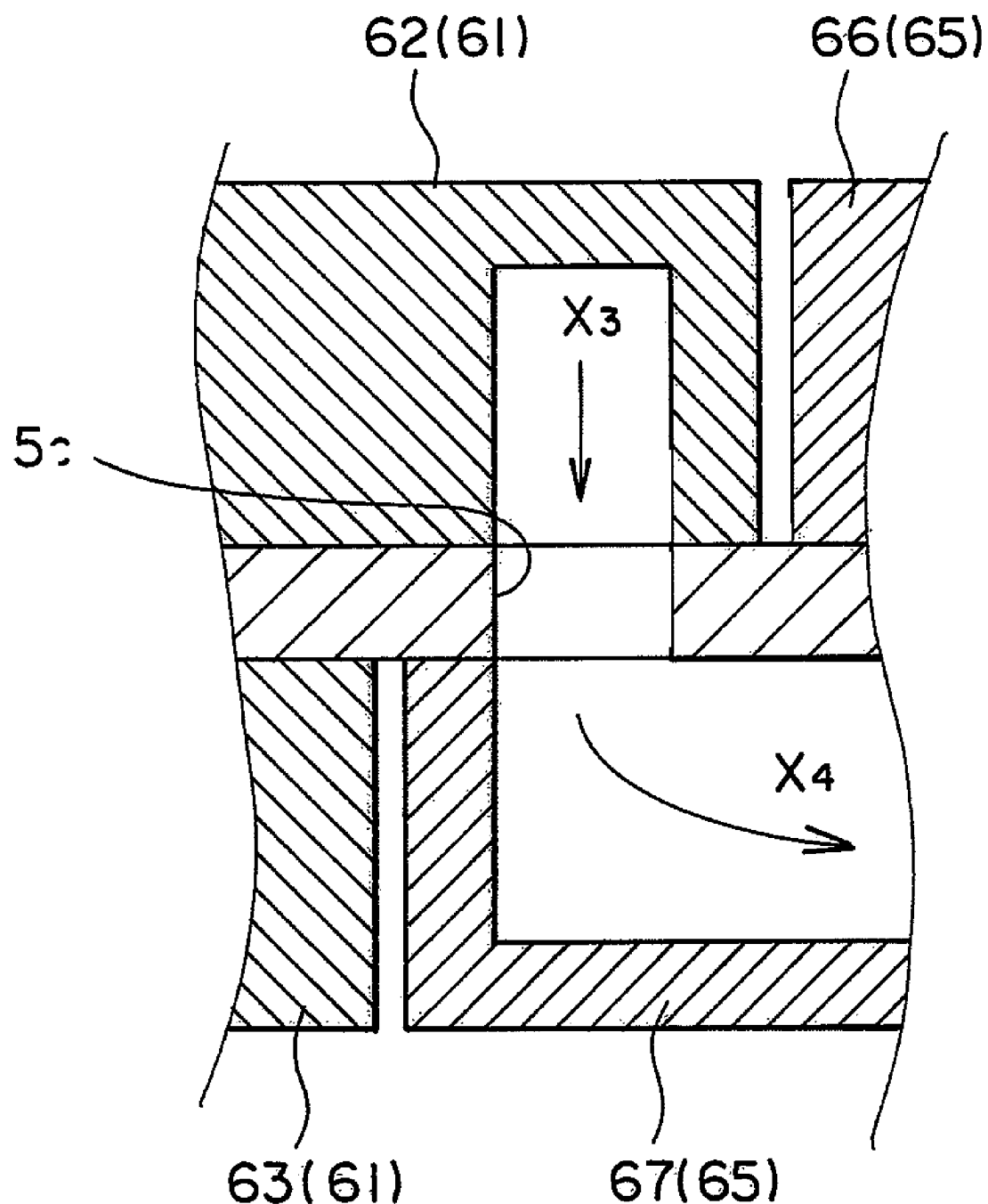
FIG. 11 is a cross-sectional view along the line XI-XI in FIG. 8 and FIG. 10.
Figure 12:
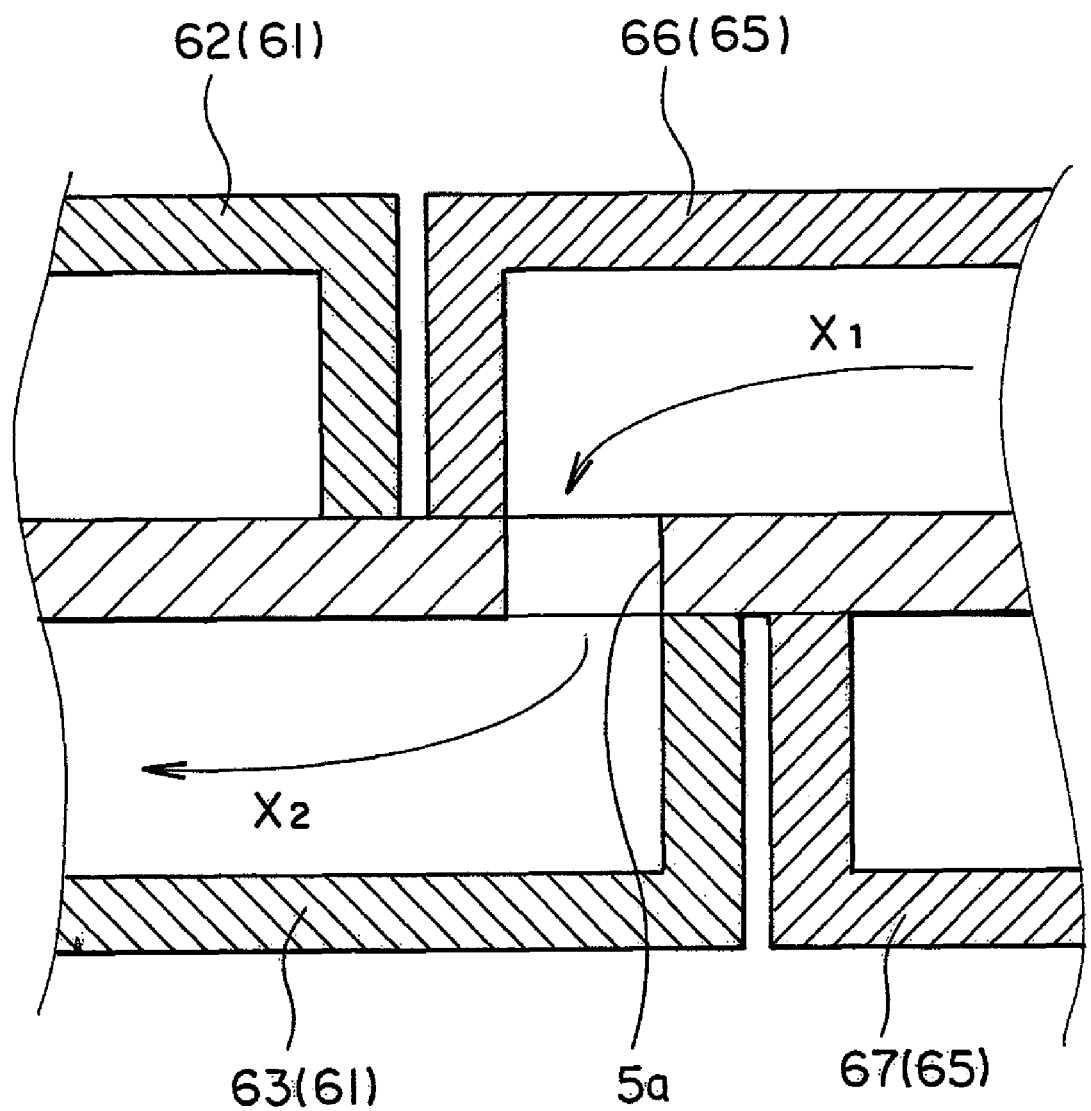
FIG. 12 is a cross-sectional view along the line XII-XII in FIG. 8 and FIG. 10.

FIG. 4A and FIG. 4B are cross-sectional views of a pin electronics card according to an embodiment of the present invention, FIG. 5 is a cross-sectional view along the line V-V of FIG. 4A and FIG. 4B, FIG. 6 is an enlarged view of a part VI of FIG. 5, FIG. 7 is a cross-sectional view showing the flow of a refrigerant in the front surface side of a pin electronics card according to an embodiment of the present invention, FIG. 8 is an enlarged view of a part VIII of FIG. 7, FIG. 9 is across-sectional view showing the flow of a refrigerant in the back surface side of a pin electronics card according to an embodiment of the present invention, FIG. 10 is an enlarged view of a part X of FIG. 9, FIG. 11 is a cross-sectional view along the line XI-XI in FIG. 8 and FIG. 10, and FIG. 12 is a cross-sectional view along the line XII-XII in FIG. 8 and FIG. 10.

The pin electronics card 4, as shown in FIG. 4A, FIG. 4B, and FIG. 5, comprises: a board 5 on which a plurality of devices TD and PD are mounted; and a device cooling cover 6 covering the devices TD and PD and formed inside it with a channel through which the refrigerant can flow. Note that FIG. 4A shows the front surface side of the pin electronics card 4, while FIG. 4B shows the back surface side of the pin electronics card 4.

Among the devices mounted on the front surface of the board 5, the four devices positioned at the upper part in FIG. 4A are measurement devices TD used for handling a test signal when testing the electrical characteristics of IC chips under test. For example, these measurement devices TD comprises high frequency circuits in which measurement LSIs etc. are assembled.

As opposed to this, among the devices mounted on the front surface of the board 5, as shown in the figure, the plurality of devices mounted at the lower part from the measurement devices TD on the front surface of the board 5 are power devices PD used for supplying test power to the IC chip under test at the time of the test. For example, these power devices PD comprises power circuits in which switching regulators are assembled.

At the back surface of the board 5 as well, similarly, as shown in FIG. 4B, four measurement devices TD are mounted at the upper part of the board 5 and a plurality of power devices PD are mounted at the lower part than it.

The measurement devices TD and the power devices PD mounted on the front and back surfaces of the board 5 in this way are devices which generate heat along with being driven when testing an IC chip under test, so have to be cooled.

The device cooling cover 6, as shown in FIG. 4A, FIG. 4B, and FIG. 5, covers the devices TD and PD mounted on the board 5. O-rings 62$b$, 63$b$, 66$b$, and 67$b$ are provided at the connecting parts of the device cooling cover 6 and the board 5 (see FIG. 6). By the device cooling cover 6 closely contacting the board 5, a channel through which a refrigerant can flow is formed. Further, by a refrigerant fed from a chiller (not shown) through a conduit 91 and an inlet 66$g$ flowing through a channel formed by the device cooling cover 6 and this refrigerant directly contacting the devices TD and PD, the heat generating devices TD and PD are cooled. After cooling the devices TD and PD, the refrigerant is returned through the outlet 67$g$ and a conduit 92 to the chiller. As the refrigerant circulating through the inside of this device cooling cover 6, a fluorine-based inert liquid (for example, Fluorinert® made by 3M) or other liquid superior in electrical insulating characteristics may be mentioned.

In the present embodiment, the device cooling cover 6 is divided into a first cover 61 provided at the upper part of the board 5 in FIG. 4A and FIG. 4B and a second cover 65 provided at the lower part of the board 5 in the figures.

The first cover 61 is provided at the front and back surfaces of the board 5 and comprises: a first front surface cover 62 provided at the front surface side of the board 5 (see FIG. 4A); and a first back surface cover 63 provided at the back surface side of the board 5 (see FIG. 4B).

The first front surface cover 62, as shown in FIG. 4A and FIG. 5, covers only the four measurement devices TD mounted on the front surface side of the board 5 and can cool these measurement devices TD.

The first back surface cover 63 similarly, as shown in FIG. 4B and FIG. 5, covers only the four measurement devices TD mounted on the back surface side of the board 5 and can cool these measurement devices TD.

The first front surface cover 61, as shown in FIG. 6, is directly fastened by a bolt 8 to the board 5 in the state with an O-ring 62b interposed at the entire peripheral edge. The second back surface cover 63 is similarly directly fastened by a bolt 8 to the board 5 in the state with an O-ring 63b interposed at the entire peripheral edge. Incidentally, in the present embodiment, by fastening the first front surface cover 62 and the first back surface cover 63 to the board 5 by the same bolt 8, the space on the board 5 is effectively utilized.

As shown in FIG. 7 and FIG. 9, a second through hole 5b passing through the board 5 from the front surface to the back surface is formed at the part of the board 5 where the first back surface cover 63 faces the first front surface cover 62. The channel formed by the first front surface cover 62 and the channel formed by the first back surface cover 63 are communicated through this second through hole 5b.

The second cover 65 is also provided on the front and back surfaces of the board 5 and comprises: a second front surface cover 66 provided on the front surface side of the board 5 (see FIG. 4A); and a second back surface cover 67 provided on the back surface side of the board 5 (see FIG. 4B).

The second front surface cover 66, as shown in FIG. 4A and FIG. 5, covers only the power devices PD mounted on the front surface side of the board 5 and cools the power devices PD.

The second back surface cover 67 similarly, as shown in FIG. 4B and FIG. 5, covers only the power devices PD mounted on the back surface side of the board 5 and can cool the power devices PD.

The second front surface cover 66 basically is fastened to the board 5 by a bolt 8 in the state with an O-ring 66b (see FIG. 6) interposed at its entire peripheral edge. However, the part of the peripheral edge of the second front surface cover 66 adjoining the first front surface cover 62 is fastened to the board 5 via the first front surface cover 62.

That is, as shown in FIG. 6, the part of the peripheral edge of the first front surface cover 62 adjoining the second front surface cover 66 is provided with a projecting part 62a projecting out toward the second front surface cover 66 side. Further, to correspond to this projecting part 62a, the part of the peripheral edge of the second front surface cover 66 adjoining the first front surface cover 62 is provided with a recessed step part 66a. Further, by having the first front surface cover 62 fastened by a bolt 8 to the board 5 in the state with the projecting part 62a of the first front surface cover 62 engaging with the step part 66a of the second front surface cover 66, the second front surface cover 66 is fastened through the first front surface cover 62 to the board 5. In this way, the first front surface cover 62 and the second front surface cover 66 share the bolt 8, so it is possible to reduce the number of parts and possible to effectively use the space on the board 5.

At this time, an insulator 7 is interposed between the projecting part 62a of the first front surface cover 62 and the step part 66a of the second front surface cover 66, so the first front surface cover 62 and the second front surface cover 66 are electrically insulated from each other. As the material which composes this insulator 7, for example, polyphenylene sulfide (PPS) resin or other hard inflammable material may be mentioned.

By electrically insulating the first front surface cover 62 and the second front surface cover 66 from each other in this way, it is possible to prevent the propagation of noise from the power devices PD covered by the second front surface cover 66 to the measurement devices TD covered by the first front surface cover 62 and possible to secure a high precision test.

Note that the first cover 61 is preferably grounded to an analog ground through a resistor having a high resistance value of an extent enabling removal of static electricity and the second cover 65 is preferably grounded to a digital ground.

The second back surface cover 67 is similarly basically fastened by a bolt 8 to the board 5 in the state with an O-ring 67b (see FIG. 9) interposed at the entire peripheral edge. However, for the part of the peripheral edge of the second back surface cover 67 adjoining the first back surface cover 63, as shown in FIG. 6, the first back surface cover 63 is fastened by a bolt 8 to the board 5 in the state where the projecting part 63a provided at the first back surface cover 63 is engaged with the step part 67a of the second back surface cover 66, whereby the second back surface cover 67 is fastened through the first back surface cover 63 to the board 5. In this way, the first back surface cover 63 and the second back surface cover 67 share the bolt 8, so it is possible to reduce the number of parts and possible to effectively use the space on the board 5.

At this time, an insulator 7 is interposed between the projecting part 63a of the first back surface cover 63 and the step part 67a of the second back surface cover 67. The first back surface cover 63 and the second back surface cover 67 are electrically insulated from each other. As the material which composes this insulator 7, in the same way as above, for example, a PPS resin etc. may be mentioned.

By mutually electrically insulating the first back surface cover 63 and the second back surface cover 67 from each other in this way, propagation of noise from the power devices PD covered by the second back surface cover 67 to the measurement devices TD covered by the first back surface cover 63 can be prevented and a high precision test can be secured.

As shown in FIG. 7 and FIG. 9, seven through holes 5d to 5j passing through the board 5 from the front surface to the rear surface are formed at the part of the board 5 where the second back surface cover 67 faces the second front surface cover 66. Through these through holes 5d to 5j, the channel formed by the second front surface cover 66 and the channel formed by the second back surface cover 67 are communicated.

Furthermore, in the present embodiment, as shown in FIG. 8, FIG. 10, and FIG. 11, the first front surface cover 62 and the second back surface cover 67 partially face each other. Further, a third through hole 5c passing through the board 5 from the front surface to the back surface is formed at the part of the board 5 where the first front surface cover 62 and the second back surface cover 67 face each other.

Similarly, as shown in FIG. 8, FIG. 10, and FIG. 12, the second front surface cover 66 and the first back surface cover 63 partially face each other. Further, a first through hole 5a passing through the board 5 from the back surface to the front surface is also formed at the part of the board 5 where the second front surface cover 66 and the first back surface cover 63 face each other.

As shown in FIG. 7, the second front surface cover 66 is provided with four partition walls 66c to 66f defining channels. Further, as shown in the same drawing, the first to third partition walls 66c to 66e define a channel from a fourth through hole 5d to a fifth through hole 5e. Further, the second to fourth partition walls 66d to 66f define channels from a sixth through hole 5f to seventh and eighth through holes 5g and 5h. Furthermore, the fourth partition wall 66f defines a channel from an inlet 66g to the first through holes 5a.

Similarly, as shown in FIG. 9, the second back surface cover 67 is also provided with four partition walls 67c to 67f defining channels. Further, as shown in the same drawing, the first and third partition walls 67c and 67e define a channel from a third through hole 5c to a fourth through hole 5d. Further, the first to third partition walls 67c to 67e define a channel from a fifth through hole 5e to a sixth through hole 5f. Furthermore, the third and fourth partition walls 67e and 67f define channels from seventh and eighth through holes 5g and 5h to an outlet 67g. Further, the fourth partition wall 67f defines a channel between a ninth through hole 5i and a 10th through hole 5j.

Therefore, in the device cooling cover 6 comprising the first cover 61 and the second cover 65 explained above, as shown in FIG. 7 and FIG. 9, a channel consisting of the inlet 66g of the first front surface cover 62→the arrow mark $X_1$ in the first front surface cover 62→the first through hole 5a→the arrow mark $X_2$ in the first back surface cover 63→the second through hole 5b→the arrow mark $X_3$ in the first front surface cover 62→the third through hole 5c→the arrow mark $X_4$ in the second back surface cover 67→the fourth through holes 5d→the arrow mark $X_5$ in the second front surface cover 66→the fifth through hole 5e→the arrow mark $X_6$ in the second back surface cover 67→the sixth through hole 5f→the arrow mark $X_7$ in the second front surface cover 66→the seventh and eighth through holes 5g, 5h→the arrow mark $X_8$ in the second back surface cover 67→the outlet 67g of the second back surface cover 67 and a channel consisting of the inlet 66g→the first front surface cover 62→the ninth through holes 5i→the arrow mark $X_9$ in the first back surface cover 63→the 10th through hole 5j→the first front surface cover 62 are formed. Further, by circulation of a refrigerant supplied from a chiller (not shown) through these channels, the heat generating devices TD and PD mounted on the front and back surfaces of the board 5 are cooled.

When using this refrigerant to cool the devices TD and PD, since the device cooling cover 6 is divided in an electrically insulated manner, switching noise or other noise generated at the power devices PD can be prevented from being propagated to the measurement devices TD and a high precision test can be secured when testing the electrical characteristics of an IC chip under test.

Further, even if dividing the device cooling cover 6, the channel formed by the first cover 61 and the channel formed by the second cover 65 are communicated through the third through hole 5c or the first through hole 5a, so it is possible to simplify the connection structure of the divided first cover 61 and second cover 65.

Note that the above explained embodiment was described to facilitate understanding of the present invention and was not described to limit the present invention. Therefore, the elements disclosed in the above embodiment include all design changes and equivalents falling under the technical scope of the present invention.

In the above embodiment, the device cooling cover 6 was divided into the first cover 61 and the second cover 65, but the present invention is not particularly limited to this. The device cooling cover 6 may also be divided into three or more parts.

Further, in the above embodiment, the first cover 61 and the second cover 65 share a bolt 8, but the present invention is not particularly limited to this. Depending on the conditions of arrangement of the divided first cover 61 and second cover 65, it is also possible not to form the projecting part 62a and step part 66a, but to attach the first cover 61 and second cover 65 to the board 5 by individual bolts 8.

In the above embodiment, the device mounted apparatus was explained with reference to a pin electronics card as an example, but the device mounted apparatus of the present invention is not particularly limited to this. So long as covering the devices mounted on the board by a device cooling cover, the invention can also be applied to apparatus other than a pin electronics card.

Further, depending on the conditions of the circuits mounted on the pin electronics card or the type of the IC chip under test, it is also possible to directly ground either the first cover 61 or second cover 65 or both. Further, it is also possible to form a grounding use conductive pattern for direct grounding at the part where the cover abuts against the board.

The invention claimed is:

1. A device mounted apparatus, comprising:
   a board on which a plurality of devices are mounted; and
   a device cooling cover covering the plurality of devices and formed with a channel through which a refrigerant can flow, wherein
   the device cooling cover includes:
   a first front surface cover covering part of the devices among the plurality of devices on a front surface of the board; and
   a second front surface cover covering at least other part of the devices among the plurality of devices on the front surface of the board,
   the first front surface cover and the second front surface cover are separate members from each other,
   the first front surface cover and the second front surface cover are made of electrical conductive material,
   a part of a peripheral edge of the first front surface cover and a part of a peripheral edge of the second front surface cover overlap to form an overlapping part,
   an insulator is interposed between the first front surface cover and the second front surface cover at the overlapping part, and
   the first front surface cover and the second front surface cover are electrically insulated from each other.

2. The device mounted apparatus as set forth in claim 1, wherein
   a top surface of the first front surface cover and a top surface of the second front surface cover are positioned generally in the same plane.

3. A test head comprising:
   a contact part which is brought into electrical contact with a device under test; and
   a device mounted apparatus as set forth in claim 1 electrically connected to the contact part.

4. An electronic device test system comprising:
   a test head as set forth in claim 3;
   a handler for bringing a device under test into electrical contact with a contact part of the test head; and
   a tester inputting a test signal to the device under test for operation and inspecting a response signal.

5. A device mounted apparatus, comprising:
a board on which a plurality of devices are mounted; and
a device cooling cover covering the plurality of devices and formed with a channel through which a refrigerant can flow, wherein
the device cooling cover includes:
a first front surface cover covering part of the devices among the plurality of devices on a front surface of the board; and
a second front surface cover covering at least other part of the devices among the plurality of devices on the front surface of the board,
the first front surface cover and the second front surface cover are separate members from each other,
a part of a peripheral edge of the first front surface cover and a part of a peripheral edge of the second front surface cover overlap to form an overlapping part,
an insulator is interposed between the first front surface cover and the second front surface cover at the overlapping part,
the first front surface cover and the second front surface cover are electrically insulated from each other,
the device mounted apparatus further comprises a fastener that fastens the first front surface cover and the second front surface cover to the board, and
at the overlapping part, only the first front surface cover is directly fastened by the fastener to the board and the second front surface cover is fastened through the first front surface cover to the board.

6. A test head comprising:
a contact part which is brought into electrical contact with a device under test; and
a device mounted apparatus as set forth in claim 5 electrically connected to the contact part.

7. An electronic device test system comprising:
a test head as set forth in claim 6;
a handler for bringing a device under test into electrical contact with a contact part of the test head; and
a tester inputting a test signal to the device under test for operation and inspecting a response signal.

8. A device mounted apparatus, comprising:
a board on which a plurality of devices are mounted; and
a device cooling cover covering the plurality of devices and formed with a channel through which a refrigerant can flow, wherein
the device cooling cover includes:
a first front surface cover covering part of the devices among the plurality of devices on a front surface of the board; and
a second front surface cover covering at least other part of the devices among the plurality of devices on the front surface of the board,
the first front surface cover and the second front surface cover are separate members from each other,
the first front surface cover and the second front surface cover are electrically insulated from each other,
the device cooling cover further includes:
a first back surface cover provided on a back surface of the board; and
a second back surface cover provided on the back surface of the board,
the first front surface cover faces the first back surface cover via the board,
the second front surface cover faces the second back surface cover via the board,
the second back surface cover partially faces the first front surface cover via the board,
the first back surface cover partially faces the second front surface cover via the board,
at least one through hole formed in the board at a part where the first back surface cover faces the first front surface cover,
at least one through hole formed in the board at a part where the second back surface cover faces the second front surface cover,
at least one through hole formed in the board at a part where the second back surface cover faces the first front surface cover, and
at least one through hole formed in the board at a part where the first back surface cover faces the second front surface cover.

9. A test head comprising:
a contact part which is brought into electrical contact with a device under test; and
a device mounted apparatus as set forth in claim 8 electrically connected to the contact part.

10. An electronic device test system comprising:
a test head as set forth in claim 9;
a handler for bringing a device under test into electrical contact with a contact part of the test head; and
a tester inputting a test signal to the device under test for operation and inspecting a response signal.

11. A device mounted apparatus, comprising:
a board on which a plurality of devices are mounted; and
a device cooling cover covering the plurality of devices and formed with a channel through which a refrigerant can flow, wherein
the device cooling cover is divided into at least a first front surface cover and a second front surface cover provided on a front surface of the board,
the first front surface cover and the second front surface cover are separate members from each other,
the first front surface cover and the second front surface cover are made of electrical conductive material,
a part of a peripheral edge of the first front surface cover and a part of a peripheral edge of the second front surface cover overlap to form an overlapping part,
an insulator is interposed between the first front surface cover and the second front surface cover at the overlapping part, and
the first front surface cover and the second front surface cover are electrically insulated from each other.

12. A test head comprising:
a contact part which is brought into electrical contact with a device under test; and
a device mounted apparatus as set forth in claim 11 electrically connected to the contact part.

13. An electronic device test system comprising:
a test head as set forth in claim 12;
a handler for bringing a device under test into electrical contact with a contact part of the test head; and
a tester inputting a test signal to the device under test for operation and inspecting a response signal.

14. The device mounted apparatus as set forth in claim 11, wherein
a top surface of the first front surface cover and a top surface of the second front surface cover are positioned generally in the same plane.

15. A device mounted apparatus, comprising:
a board on which a plurality of devices are mounted; and
a device cooling cover covering the plurality of devices and formed with a channel through which a refrigerant can flow, wherein the device cooling cover is divided into at least a first front surface cover and a second front surface cover provided on a front surface of the board, the first front surface cover and the second front surface cover are separate members from each other, the first front surface cover and the second front surface cover are electrically insulated from each other, the device cooling cover further includes a first back surface cover and a second back surface cover provided on a back surface of the board, the first front surface cover faces the first back surface cover via the board, the second front surface cover faces the second back surface cover via the board, the second back surface cover partially faces the first front surface cover via the board, the first back surface cover partially faces the second front surface cover via the board, and the board is formed with through holes for flowing a refrigerant, wherein the second back surface cover and the first front surface cover face each other through at least one of the through holes, the first back surface cover and the second front surface cover face each other through at least one of the through holes, the first back surface cover and the first front surface cover face each other through at least one of the through holes, and the second back surface cover and the second front surface cover face each other through at least one of the through holes.

16. A test head comprising:

a contact part which is brought into electrical contact with a device under test; and a device mounted apparatus as set forth in claim 15 electrically connected to the contact part.

17. An electronic device test system comprising:

a test head as set forth in claim 16;

a handler for bringing a device under test into electrical contact with a contact part of the test head; and a tester inputting a test signal to the device under test for operation and inspecting a response signal.

18. A device mounted apparatus, comprising:

a board on which a plurality of devices are mounted; and a device cooling cover covering the plurality of devices and formed with a channel through which a refrigerant can flow, wherein the device cooling cover is divided into at least a first front surface cover and a second front surface cover provided on a front surface of the board, the first front surface cover and the second front surface cover are separate members from each other, a part of a peripheral edge of the first front surface cover and a part of a peripheral edge of the second front surface cover overlap to form an overlapping part, an insulator is interposed between the first front surface cover and the second front surface cover at the overlapping part, and the first front surface cover and the second front surface cover are electrically insulated from each other, the device mounted apparatus further comprises a fastener configured to fasten the first front surface cover and the second front surface cover to the board, and at the overlapping part, only the first front surface cover is directly fastened by the fastener to the board and the second front surface cover is fastened through the first front surface cover to the board.

19. A test head comprising:

a contact part which is brought into electrical contact with a device under test; and a device mounted apparatus as set forth in claim 18 electrically connected to the contact part.

20. An electronic device test system comprising:

a test head as set forth in claim 19;

a handler for bringing a device under test into electrical contact with a contact part of the test head; and a tester inputting a test signal to the device under test for operation and inspecting a response signal.

* * * * *